(12) United States Patent
Cooper

(10) Patent No.: US 7,078,931 B2
(45) Date of Patent: Jul. 18, 2006

(54) GTL OUTPUT STRUCTURE HAVING A SLEW RATE CONTROL RESTORE CIRCUIT

(75) Inventor: Michael D. Cooper, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 11/013,663

(22) Filed: Dec. 16, 2004

(65) Prior Publication Data

US 2006/0012397 A1    Jan. 19, 2006

Related U.S. Application Data

(60) Provisional application No. 60/588,171, filed on Jul. 14, 2004.

(51) Int. Cl.
*H03K 19/003*    (2006.01)
(52) U.S. Cl. .............................. 326/26; 326/27; 326/31; 326/33
(58) Field of Classification Search ............ 326/26–27, 326/30–34, 87; 327/108–112
See application file for complete search history.

(56) References Cited

U.S. PATENT DOCUMENTS 5,694,065 A * 12/1997 Hamasaki et al. .......... 327/108
6,433,592 B1 * 8/2002 Ehben ........................ 327/108

* cited by examiner

*Primary Examiner*—Anh Q. Tran
(74) *Attorney, Agent, or Firm*—W. James Brady, III; Frederick J. Telecky, Jr.

(57) ABSTRACT

A GTL output structure having an active charging and discharging stage that actively restores internal nodes for slew rate control without the need to wait for a slow rise and fall RC time constant is disclosed herein. The novel GTL output structure includes an input stage connected to an RC network for providing slew rate control. The output stage connects between the RC network and a feedback network. The feedback network in includes an active charging stage for providing a charging current to the gate of the at least one transistor for a period of time to the value of a power supply rail and wherein the feedback network includes an active discharging stage for providing a discharge current from the gate of the at least one transistor to ground.

14 Claims, 3 Drawing Sheets

GTL OUTPUT STRUCTURE HAVING A SLEW RATE CONTROL RESTORE CIRCUIT

This application claims priority under 35 USC 119(e) of provisional application Ser. No. 60/588,171 filed Jul. 14, 2004

FIELD OF THE INVENTION

The present invention relates to Gunning Transceiver Logic (GTL) output structures and, more particularly, to a GTL output structure having a slew rate control restore circuit.

BACKGROUND OF THE INVENTION

Computer systems and other digital systems often include a large number of very large scaled integrated (VLSI) circuits that are connected by a single segment or multi-segment transmission line for binary communications. Drivers and receivers interface between these VLSI circuits and the transmission lines. Gunning Transceiver Logic (GTL) for input and output structures has been designed to provide a low-swing interface in these high-speed digital systems. An objective of the GTL interface standard is to improve the performance of high speed digital systems by reducing the difference between the logic high voltage level and the logic low voltage level. Gunning (U.S. Pat. No. 5,023,488, which is incorporated by reference herein) discloses such GTL drivers and receivers for interfacing VLSI CMOS circuits to transmission lines. The nominal voltage swing of GTL is approximately 0.3 Volts (logic low) to 1.2 Volts (logic high).

A GTL output driver is an open-drain N-channel device which, when turned off, is pulled up to the output supply voltage and, when turned on, the device can sink up to 40 mA of current at a maximum output voltage of 0.4V. The output driver is designed for a doubly-terminated 50 Ω transmission line.

More particularly FIG. 1 displays a known GTL driver 30 that is disclosed in Gunning. A very wide channel, open drain, N-channel CMOS transistor M1 is used for transforming binary signals to a transmission line 32 from a more or less conventional CMOS signal source 34 which effectively isolates the transmission line 32 from the ordinary 5 v rail-to-rail signal swing of the signal source 34. Transistor M1 has its gate connected to the output of the signal source 34, its drain connected to the transmission line 32, and its source returned to ground (i.e., the same reference level as the 0 v rail of the signal source 34). The channel width of the transistor M1 is orders of magnitude greater than its channel length to reduce the effective resistance of its source-drain circuit in conduction.

In operation, when the signal at $V_{IN}$, drops to a low ("0") logic level, transistors M2 and M3 are switched into and out of conduction, respectively. Thus, the gate capacitance of transistor M1 is charged relatively rapidly by the current conducted by the source-drain circuit of transistor M2. The gate of transistor M1 is quickly pulled up toward the 5 Volt rail of the signal source 14, thereby causing transistor M1 to promptly switch into conduction. On the other hand, when the signal $V_{IN}$ increases to a high ("1") logic level, transistor M2 switches out of conduction while transistor M3 switches into conduction. This causes the gate capacitance of transistor M1 to be quickly discharged by the current conducted by the source-drain circuit of transistor M3 so that the gate of transistor M1 is pulled down relatively rapidly toward the 0 Volt rail of the signal source 14, thereby promptly switching transistor M1 out of conduction.

The signal level on the transmission line 32 tends to stabilize substantially at the voltage level to which the transmission line 32 is terminated a short time after transistor M1 is switched out of conduction (i.e., as soon as the switching transients have settled out). On the other hand, when transistor M1 is switched into conduction, its source-drain circuit provides a ground return path for current flow through the parallel terminating resistors indicated by 36. The signal level at which the transmission line 32 tends to stabilize (again, after the switching transients have settled out) is determined by the voltage division which the parallel terminating resistor 36 and the source-drain resistance of the conductive transistor M1 perform on the voltage to which the transmission line 32 is terminated.

Provision is made in the driver 30 for damping certain of the switching transients which are generated when transistor M1 is switched into and out of conduction. Some of the more troublesome switching transients occur when transistor M1 is switched from a conductive state to a non-conductive state. The drain-side parasitic packaging inductance and the drain-side parasitic capacitances of transistor M1 form a ringing circuit which tends to cause the voltage on the transmission line 32 to overshoot its nominal upper limit by a substantial margin and to oscillate for a prolonged period of time. Similarly, the source-side parasitic inductances and capacitances of transistor M1 form another ringing circuit which tends to cause a potentially troublesome oscillatory "ground bounce" perturbance of the reference voltage on the low level rail of the CMOS circuit.

To reduce these switching transients, the driver 30 is equipped with a feedback circuit for briefly connecting the drain of transistor M1 to its gate when transistor M1 is switched from a conductive state to a non-conductive state. The feedback circuit includes a pair of n-channel transistors M4 and M5 which have their source-drain circuits connected in series between the drain and gate of transistor M1. The input $V_{IN}$ for the driver 30 is coupled to the gate of transistor M5, and two additional inverter stages 37 and 38 are coupled between the inverter 34 and the gate of transistor M4.

Most GTL output circuits include a means to control output slew rates. Internal signals must transition fairly slowly to accomplish having controlled output slew rates. As frequency increases, however, the signals present at internal nodes within the GTL output circuit do not have enough time to make a normal full transition. As a result, slew rate control is impacted when these internal signals do not start from a desired level.

Thereby, a need exists for slew rate control of the internal nodes of the GTL driver. Conventional approaches for incorporating slew rate control at higher frequencies, however, use passive components only and, thereby, a slow rise and fall RC time constant exists that controls the output transistors. Accordingly, there is a substantial waiting period for the slow RC time constant in bringing the output node of the transmission line driver up to the power supply rail ($V_{CC}$) or down to ground (GND). Moreover, as a result, internal nodes within the output driver begin at a point somewhere between the power supply rail $V_{CC}$ and ground GND. Thereby, an effective slew rate control at the output does not exist and, as a result, the output can rise too fast which can cause signal integrity problems. In the alternative, duty cycle problems arise where the delay to the output from the input signal might vary from that which is normally expected. Accordingly, duty cycle issues exist. For example, give a clocked system that must maintain a 50% duty cycle, unfortunately, one edge of the output signal may start to speed up which will lead to an actual 60% duty cycle. The objective of most designers is to maintain the same propagation delay from input to output to prevent these duty cycle problems.

Thus, there is a need for a GTL transmission line driver that provides an output voltage swing of approximately 0.3 Volts (logic low) to 1.2 Volts (logic high) and that overcomes the problems of a modified duty cycle and the loss of slew rate control of the conventional GTL driver discussed above.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of GTL output drivers, the present invention teaches a GTL output driver that overcomes the problem of loss of slew rate control and duty cycle problems by pulling the internal slew rate control nodes all the way to either power supply rail in an effort to start at the proper point for the next transition. This GTL output driver includes an active charging and discharging stage that actively restores internal nodes for slew rate control without the need to wait for a slow rise and fall RC time constant. Specifically, the novel GTL output driver includes an input stage connected to an RC network for providing slew rate control. The output stage connects between the RC network and a feedback network. The feedback network includes an active charging stage for providing a charging current to the gate of the at least one transistor for a period of time to the value of a power supply rail and wherein the feedback network includes an active discharging stage for providing a discharge current from the gate of the at least one transistor to ground.

The input stage may include a second, third and fourth transistor connected in series between the power supply rail and ground. In addition, a fifth, sixth and seventh transistor are connected in series between the power supply rail and ground. The second, fourth, fifth and seventh transistors are biased by the input node, while the third and sixth transistors are biased an internal node within the feedback network.

In a first embodiment the RC network may include a first and a second resistor connected between an internal nodes that couple to the input stage and an internal node that biases the output transistor in the output stage, wherein the output stage includes only one output transistor. The design of feedback network for this embodiment includes a discharge stage that includes one discharging N-channel transistor that couples to the output transistor to discharge the transistor to ground. In addition, the feedback network for this embodiment includes a charging stage that includes one charging P-channel transistor that couples to the output transistor to charge the transistor up to the power supply rail voltage $V_{CC}$.

In a second embodiment the RC network may include a first, second, third and fourth resistor connected to provide bias for a first, second and third output transistor implemented within the output stage. The design of feedback network for this embodiment includes a discharge stage having a first, second and third discharging N-channel transistor that couples to the respective first, second, and third output transistor to discharge the transistor to ground GND. In addition, the feedback network for this embodiment includes a charging stage that includes a first, second, and third charging P-channel transistor that couples to the respective first, second, and third output transistor to charge the transistor up to the power supply rail voltage $V_{CC}$.

The advantages of this GTL output driver includes but is not limited to a GTL transmission line driver that provides an output voltage swing of approximately 0.3 Volts (logic low) to 1.2 Volts (logic high) and that overcomes the problems of a modified duty cycle and the loss of slew rate control of the conventional GTL driver.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
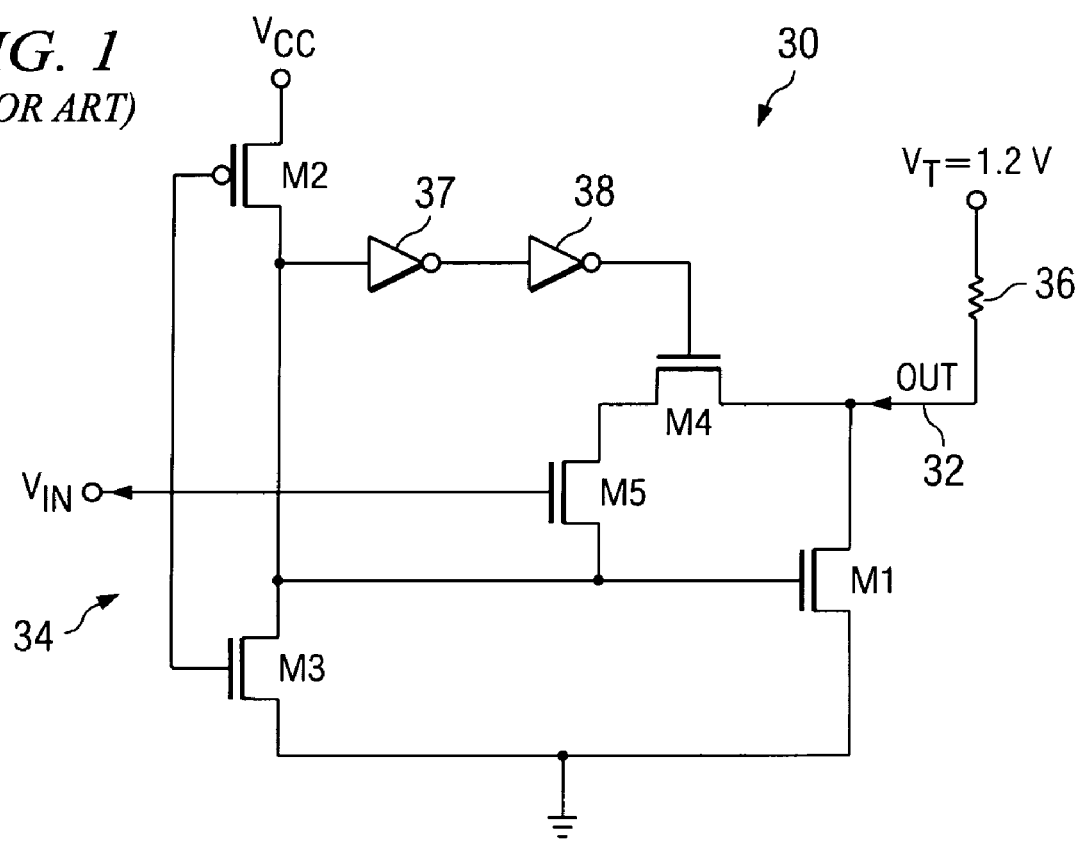
FIG. 1 is a known GTL output driver.

One or more exemplary implementations of the present invention will now be described with reference to the attached drawings, wherein like reference numerals are used to refer to like elements throughout. The various aspects of the invention are illustrated below in a GTL output driver, although the invention and the appended claims are not limited to the illustrated examples.

Figure 2:
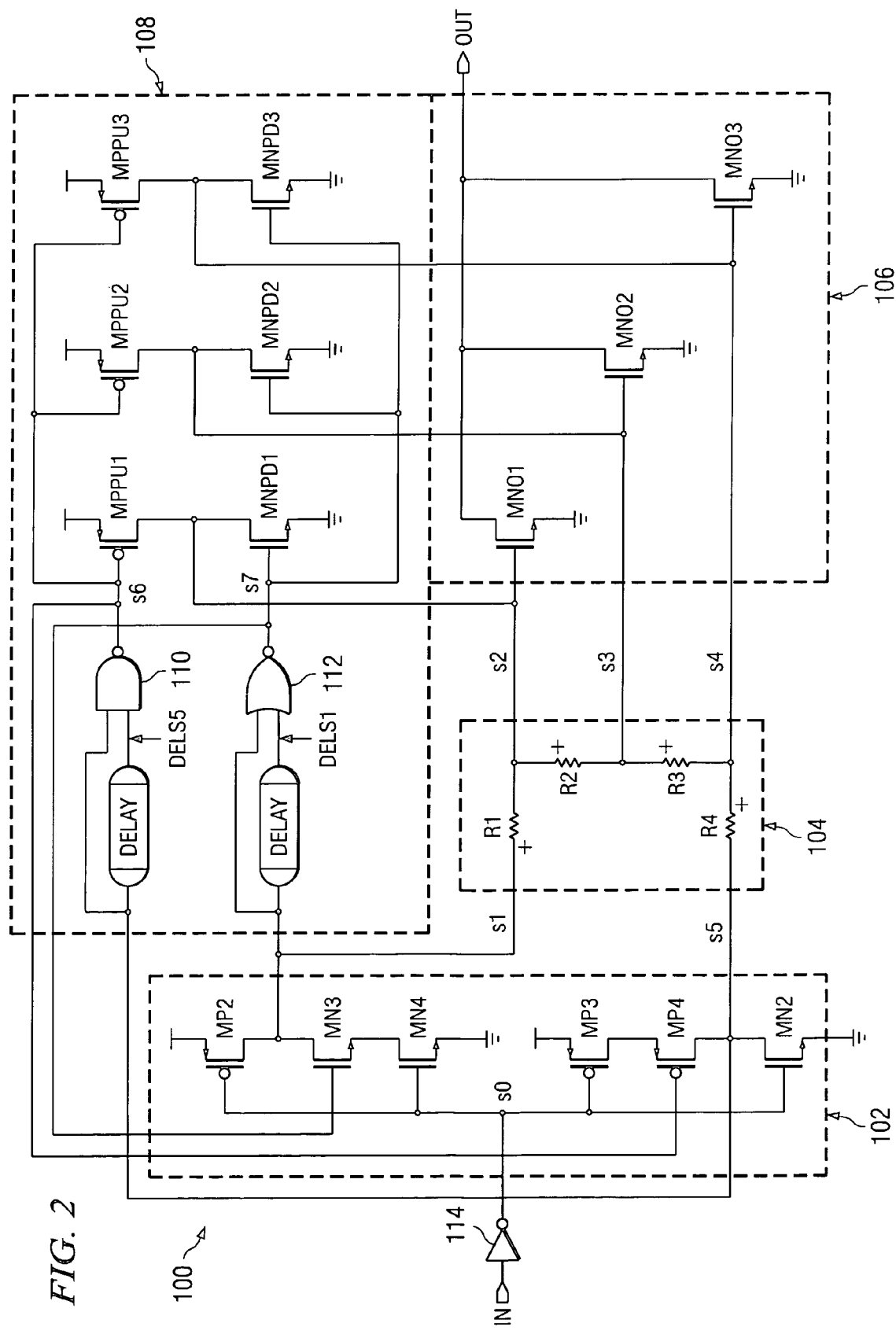
FIG. 2 illustrates the novel GTL output driver in accordance with the present invention.

FIG. 2 illustrates the novel GTL output driver that provides a means to actively restore internal nodes to desired levels at the end of an output transition. In general, the circuit 100 is an open drain GTL type output. An input stage 102 connects between the input node IN and the RC network 104, having resistors R1-R4 coupled as shown. Input stage 102 includes a first transistor MP2 connected between the power supply rail $V_{CC}$ and a first internal node S1. A second transistor MN3 connects between the first internal node S1 and a third transistor MN4 which coupled to ground GND, wherein the first and the third transistor, MP2 and MN4, are biased by the input signal IN. The second transistor MN3, however, is biased through the feedback network 108. A fourth transistor MP3 connects between the power supply rail $V_{CC}$ and a fifth transistor MP4. A sixth transistor MN2 connects between internal node S5 and ground GND. An output stage 106 connects between the RC network 104 and the feedback network 108. The output stage 106 may include at least one transistor, MN01, MN02 or MN03, coupled between the output node OUT and ground GND for conducting current from the output node OUT to ground GND. Output transistors, MN01, MN02 and MN03, are used to provide a gradual, staged turn off and turn on time. The RC network 104 serves as a bias for the at least one transistor, MN01, MN02 or MN03. Transistors, MN01, MN02, and MN03, provide slew rate control, wherein transistors, MN01, MN02, and MN03, are turned 'on' sequentially which provides slew rate control. These transistors, MN01, MN02, and MN03, effectively make the GTL output driver 100 open drain output which is widely used in the industry for driving buses. Those skilled in the art would recognize that the output stage may include one or more transistors. Corresponding active discharging and charging stages must be included when the numbers of the transistors in the output stage are altered as described as follows.

The feedback network 108 connects between the output stage and the input stage. Network 108 includes an active charging stage that provides a charging current to the gate of the at least one transistor, MN01, MN02 or MN03, for a period of time to the value of a power supply rail. Specifically, transistor MPPU1 connects between the power supply rail and the second internal node S2, wherein the second internal node S2 biases the first output transistor MN01. Accordingly, transistor MPPU2 connects between the power supply rail and the third internal node S3, wherein the third internal node S3 biases the second output transistor MN02. Transistor MPPU3 connects between the power supply rail and the fourth internal node S4, wherein the fourth internal node S4 biases the third output transistor MN03. Output slew rate control is determined by the gate voltages at nodes S2, S3, and S4.

Feedback network 108 also includes an active discharging stage for providing a discharge current from the gate of the at least one transistor, MN01, MN02 or MN03, to ground. Specifically, transistor MNPD1 connects between the second internal node S2 and ground GND. Moreover transistors, MNPD2 and MNPD3, connect between the respective third and fourth internal nodes and ground GND.

Moreover, feedback network 108 includes a two input NAND gate 110 that connects to receive the signal from internal node S5. Both the signal S5 and the delayed version of signal S5 are received by NAND gate 110 to supply bias for the gates of transistors, MPPU1, MPPU2, and MPPU3. NOR gate 112 couples to receive the signal from internal node S1 and a delayed version of this same signal S1 to provide bias for the gates of transistors, MNPD1, MNPD2 and MNPD3. In the event that some type of loading on the output needs to be accounted, NAND and NOR gates, 110 and 112, each having a respective delayed input, provide extra time in an effort to ensure that the output OUT is not taken prematurely to either rail, $V_{CC}$ or GND. Those skilled in the art should recognized that these gates, 110 and 112, are optional. In the alternative, gates 110 and 112 may be replaced with regular CMOS type inverters.

Accordingly, the RC time is established by resistors R1–R4 and the inherent capacitance at nodes S1-S5 sets the gate voltage at nodes S2–S4 over time to provide the desired output rise and fall time slew rates. The novel GTL output driver 100 in accordance with the present invention provides a means to actively and fully restore nodes S1–S7 to either the power supply rail $V_{CC}$ or ground GND prior to the next signal transition, without waiting for the nodes S2–S4 to passively fully charge through the RC network 104. RC network 104 shapes S2–S4 gate voltages and is fairly slow to provide proper slew rate control.

In operation, during a high to low transition, internal node S0 goes from high to low and turns transistor MP2 'on' and transistor MN4 'off'. As a result, internal node S1 immediately is forced to the power supply rail $V_{CC}$. Transistor MN2 is turned 'off' and transistor MP3 is turned 'on'. The effect of transistor MP3, however, is masked by transistor MP4. In response to internal node S6, transistor MP4 remains 'off', making internal node S5 essentially a floating capacitance previously charged to ground GND. The RC network 104, having internal node S1 at the power supply rail $V_{CC}$ and internal node S5 at ground GND, slowly charges up internal nodes S2–S4 providing a controlled output fall time slew rate. When internal node S1 goes to power supply rail $V_{CC}$, internal node S7 immediately goes to a low which turns 'off' transistors, MNPD1, MNPD2, and MNPD3. This ensures that internal nodes S2–S4 are charged up to power supply rail $V_{CC}$.

At the transition start, internal node S5 is at ground GND which immediately sets internal node S6 to power supply rail $V_{CC}$. This ensures transistors, MPPU1, MPPU2, and MPPU3, are off, allowing internal nodes S2–S4 to charge up to power supply rail $V_{CC}$. As internal node S2–S4 gradually charge towards power supply rail $V_{CC}$ at internal node S1, the output transistors, MN01, MN02 and MN03, turn on in a controlled manner and provide the desired output fall time slew rate. Eventually internal node S5 charges high enough to be sensed as a logic high to the NAND gate 110 with a time delayed input. After the time delay, the NAND gate 110 has both inputs at logic high which sets the NAND gate output S6 to a low state. The delay time is typically under 1 ns and may be formed by a series of inverters. This extra delay, beyond the time when internal node S5 gets to a logic high, is just a small extra buffer time to ensure internal node S6 is not prematurely set low, before a full output transition. When internal node S6 goes low, two events occur to restore several of the internal nodes to proper levels prior to the next transition. First, transistors, MPPU1, MPPU2, and MPPU3, turn 'on' which actively sets internal nodes S2–S4 to the power supply rail $V_{CC}$. In addition, transistor MP4 turns 'on' allowing transistor MP3 to bring node internal node S5 fully to the power supply rail $V_{CC}$. All nodes in the RC network are now actively fully restored to the power supply rail $V_{CC}$ without waiting for a passive RC charge up. This ensures proper slew rate control on the next transition since all nodes will start from the preferred levels rather than some intermediate level that may not provide the desired output slew rate control.

During the low to high transition, internal node S0 goes from low to high and turns transistor MP3 'off' and MN2 'on'. Internal node S5 is immediately forced to ground GND. As a result, transistor MN4 is turned 'on' and transistor MP2 is turned 'off'. The effect of transistor MN4, however, is masked by transistor MN3. Accordingly, transistor MN3 remains 'off' in response to internal node S7 making internal node S1 essentially a floating capacitance that had been previously charged to power supply rail $V_{CC}$ level. When internal node S5 at ground GND and internal node S1 at power supply rail $V_{CC}$, RC network 104 slowly discharges internal nodes S2–S4 providing a controlled output rise time slew rate. When internal node S5 goes to ground GND, internal node S6 immediately goes to a 'high' which turns 'off' transistors, MPPU1, MPPU2, and MPPU3, ensuring that internal nodes S2–S4 discharge.

At the transition start, internal node S1 is at the power supply rail $V_{CC}$ level which immediately sets internal node S7 to ground GND. This ensures transistors, MNPD1, MNPD2, and MNPD3, are off, allowing internal nodes S2–S4 to discharge. As internal nodes S2–S4 gradually discharge towards ground GND, the output transistors, MN01, MN02, and MN03, turn 'off' in a controlled manner and provide the desired output rise time slew rate. Eventually internal node S1 discharges low enough to be sensed as a logic 'low' to NOR gate 112 having the time delayed input as shown. After the time delay, NOR gate 112 has both inputs at logic 'low' which sets the output, internal node S7, of NOR gate 112, to a 'high' state. The delay time is typically under 1 ns and, in the alternative, may be formed by a series of inverters (not shown). This extra delay, beyond the time when internal node S1 gets to a logic 'low' is just a small extra buffer time to ensure internal node S7 is not prematurely set high, before a full output transition. When the internal node S7 is 'high', two events occur to restore most internal nodes to proper levels prior to the next transition. First, transistors, MNPD1, MNPD2, and MNPD3, turn 'on' and actively set internal nodes S2–S4 to a ground GND level. Furthermore, transistor MN3 turns 'on' allowing transistor MN4 to bring internal node S1 fully to ground GND. At this point, all nodes in the RC network 104 are actively fully restored to ground GND without waiting for a passive RC discharge. This ensures proper slew rate control on the next transition since all nodes will start from the preferred levels rather than some intermediate level that may not provide the desired output slew rate control.

In summary, transistors, MNPD1, MNPD2, and MNPD3, are the active restoring clamps, wherein when transistors, MN01, MN02, and MN03, of the output stage 106 are in the process of being turned 'off', the active restoring clamps, MNPD1, MNPD2, and MNPD3, actively restore the gate drive of each of the transistors, MN01, MN02, and MN03, to pull them down immediately to ground GND. In the alternative, transistors, MPPU1, MPPU2, and MPPU3, are the active restoring clamps when the transistors, MN01, MN02, and MN03, of the output stage 106 are in the process of being turned 'on', the active restoring clamps actively restore the gate drive of each of the transistors, MN01, MN02, and MN03, to pull them up immediately to be restored to power supply rail $V_{CC}$.

Figure 3:
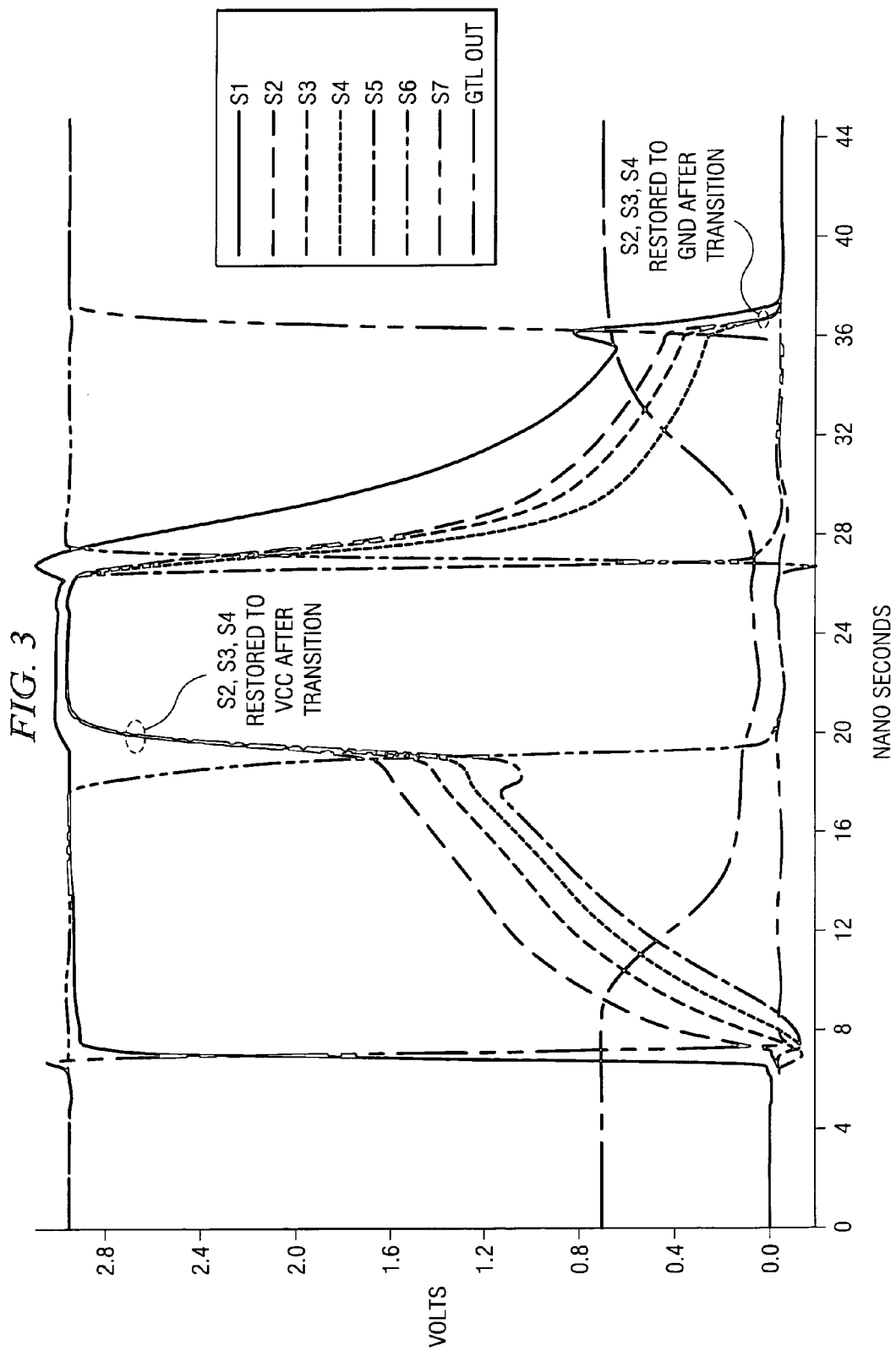
FIG. 3 displays voltage response at internal nodes S2–S7 with respect to the output GTL OUT.

FIG. 3 displays the slew rate control for internal nodes, S2, S3, and S4. In the first part of the graph farthest to the left, internal nodes, S2, S3, and S4, passively increase relative to the RC time constant going towards the power supply rail $V_{CC}$. After the GTL output OUT transitions 'low', internal nodes, S2, S3, and S4, actively get pulled up to the power supply rail $V_{CC}$. On the right side of the FIG. 3, internal nodes, S2, S3, and S4, having passively decay to ground GND relative to the RC time constant. Yet, after the transition of the GTL output OUT from 'low' to 'high', these same nodes, S2, S3, and S4, are immediately restored to ground GND. This novel GTL output structure 100 provides an active pull to the power supply rail $V_{CC}$ or an active pull down to ground GND such that the circuit 100 is ready for the next transition to occur. Therein, the next transition does not occur at some mid-point between power supply rail VCC and ground which is customary for conventional designs that wait for the passive decay of internal nodes, S2, S3, and S4.

The advantages of this novel, include but are not limited to a GTL output driver that utilizes active charging and discharging stages to restore internal nodes to preferred levels. Therein, all internal nodes are rapidly restored to preferred levels prior to the next output transition, even at high frequencies, ensuring proper slew rate control is maintained.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims that follow.

Those of skill in the art will recognize that the physical location of the elements illustrated in FIG. 3 can be moved or relocated while retaining the function described above. Furthermore, those skilled in the art may recognized that each resistor R1, R2, R3, and R4 may be substituted with a MOSFET transistor in the linear mode wherein the transistor is not saturated.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A driver for providing binary signals from a data system to a transmission line, the driver having an input node and an output node for connection to the transmission line, the driver comprising:
    an input stage coupled to an input node;
    an RC network coupled to the input stage for providing slew rate control;
    an output stage coupled to the RC network having at least one transistor coupled between the output node and ground for conducting current from the output node to ground, the at least one transistor biased by the RC network; and
    a feedback network coupled between the output stage and the input stage, wherein the feedback network includes an active charging stage for providing a charging current to the gate of the at least one transistor for a period of time to the value of a power supply rail and wherein the feedback network includes an active discharging stage for providing a discharge current from the gate of the at least one transistor to ground.

2. A driver as recited in claim 1, further comprising an inverter coupled between the input node and the input stage.

3. A driver as recited in claim 1, wherein the input stage comprises:
    a second transistor coupled between the power supply rail and a first node, the second transistor biased by the input node;
    a third transistor coupled between the first node and a second node, the third transistor biased by the feedback network;
    a fourth transistor coupled between the second node and ground, the fourth transistor biased by the input node;
    a fifth transistor coupled between the power supply rail and a third node, the fifth transistor biased by the input node;

a sixth transistor coupled between the third node and a fourth node, the sixth transistor biased by the feedback network; and a seventh transistor coupled between the fourth node and ground, the seventh transistor biased by the input node.

4. A driver as recited in claim 1, wherein the RC network comprises:

a first resistor coupled between a first internal node and a second internal node, the first internal node coupled to the input stage; and a second resistor coupled between the second internal node and a third internal node, the third internal node coupled to the input stage.

5. A driver as recited in claim 4, wherein the at least one transistor is biased by the second internal node.

6. A driver as recited in claim 4, wherein the feedback stage comprises:

an active discharging stage having a N-channel transistor coupled between the second internal node and ground;

an active charging stage having a P-channel transistor coupled between the second internal node and the power supply rail;

a first delay element coupled to the input stage;

a NAND gate, having a first input, a second input, and an output, the first input coupled to the input stage, the second input coupled to the first delay element, the P-channel transistor biased by the output of the NAND gate;

a second delay element coupled to the input stage; and a NOR gate, having a first input, a second input, and an output, the first input coupled to the input stage, the second input coupled to the second delay element, wherein the N-channel transistor biased by the output of the NOR gate.

7. A driver as recited in claim 1, wherein the RC network comprises:

a first resistor coupled between a first internal node and a second internal node, the first internal node coupled to the input stage;

a second resistor coupled between the second internal node and a third internal node;

a third resistor coupled between the third internal node and a fourth internal node; and a fourth resistor coupled between the fourth internal node and a fifth internal node, the fifth internal node coupled to the input stage.

8. A driver as recited in claim 7, wherein the output stage comprises a first output transistor coupled between the output node and ground for conducting current from the output node to ground, wherein the first output transistor biased by the second internal node;

a second output transistor coupled between the output node and ground for conducting current from the output node to ground, wherein the second output transistor biased by the third internal node; and a third output transistor coupled between the output node and ground for conducting current from the output node to ground, wherein the third output transistor biased by the fourth internal node.

9. A driver as recited in claim 8, wherein the feedback stage comprises:

an active discharging stage comprises, a first discharging transitory coupled between the second internal node and ground, a second discharging transitory coupled between the third internal node and ground, and a third discharging transitory coupled between the fourth internal node and ground;

an active charging stage comprises, a first charging transitory coupled between the second internal node and the power supply rail, a second charging transitory coupled between the third internal node and the power supply rail, and a third charging transitory coupled between the fourth internal node and the power supply rail;

a first delay element coupled to the input stage;

a NAND gate, having a first input, a second input, and an output, the first input coupled to the input stage, the second input coupled to the first delay element, wherein the first, second and third charging transistors are biased by the output of the NAND gate;

a second delay element coupled to the input stage; and a NOR gate, having a first input, a second input, and an output, the first input coupled to the input stage, the second input coupled to the second delay element, wherein the first, second and third discharging transistors are biased by the output of the NOR gate.

10. A driver as recited in claim 9, wherein the first discharging transistor, the second discharging transistor, and the third discharging transitory are N-channel transistors.

11. A driver as recited in claim 9, wherein the first charging transistor, the second charging transistor, and the third charging transitory are P-channel transistors.

12. A driver as recited in claim 1, wherein the RC network comprises:

a first transistor coupled between a first internal node and a second internal node, the first transistor operable in the linear region; and a second transistor coupled between the second internal node and a third internal node, the second transistor operable in the linear region.

13. A driver as recited in claim 12, wherein the at least one transistor is biased by the second internal node.

14. A driver as recited in claim 12, wherein the feedback stage comprises:

an active discharging stage having a N-channel discharging transistor coupled between the second internal node and ground;

an active charging stage having a P-channel charging transistor coupled between the second internal node and the power supply rail;

a first delay element coupled to the input stage;

a NAND gate, having a first input, a second input, and an output, the first input coupled to the input stage, the second input coupled to the first delay element, the P-channel charging transistor biased by the output of the NAND gate;

a second delay element coupled to the input stage; and a NOR gate, having a first input, a second input, and an output, the first input coupled to the input stage, the second input coupled to the second delay element, wherein the N-channel discharging transistor biased by the output of the NOR gate.

* * * * *